US007015723B2

(12) United States Patent
Chu et al.

(10) Patent No.: US 7,015,723 B2
(45) Date of Patent: Mar. 21, 2006

(54) DYNAMIC-STATIC LOGICAL CONTROL ELEMENT FOR SIGNALING AN INTERVAL BETWEEN THE END OF A CONTROL SIGNAL AND A LOGICAL EVALUATION

(75) Inventors: Sam Gat-Shang Chu, Round Rock, TX (US); Peter Juergen Klim, Austin, TX (US); Michael Ju Hyeok Lee, Austin, TX (US); Jose Angel Paredes, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/922,271

(22) Filed: Aug. 19, 2004

(65) Prior Publication Data

US 2006/0038588 A1    Feb. 23, 2006

(51) Int. Cl.
*H03K 19/00* (2006.01)
(52) U.S. Cl. .................. 326/121; 326/119; 326/93
(58) Field of Classification Search ............ 326/93–98, 326/112, 119, 121
See application file for complete search history.

(56) References Cited

U.S. PATENT DOCUMENTS

| 6,275,071 B1 * | 8/2001 | Ye et al. ................... 326/98 |
| 6,344,759 B1 * | 2/2002 | Srivastava et al. ............ 326/98 |
| 6,492,837 B1 * | 12/2002 | Narendra et al. ............. 326/95 |
| 6,529,045 B1 * | 3/2003 | Ye et al. ........................ 326/95 |
| 6,650,145 B1 * | 11/2003 | Ngo et al. ..................... 326/98 |
| 6,690,204 B1 * | 2/2004 | Belluomini et al. .......... 326/95 |
| 6,707,318 B1 * | 3/2004 | Kumar et al. ................. 326/98 |
| 6,717,442 B1 * | 4/2004 | Campbell ..................... 326/95 |
| 6,791,365 B1 * | 9/2004 | Bosshart ...................... 326/98 |
| 6,919,739 B1 * | 7/2005 | Ngo .............................. 326/98 |

\* cited by examiner

*Primary Examiner*—Don Le
(74) *Attorney, Agent, or Firm*—Weiss, Moy & Harris, P.C.; Andrew M. Harris; Casimer K. Salys

(57) ABSTRACT

A dynamic-static logical control element for signaling an interval between the end of a control signal and a logical evaluation provides a compact circuit for blocking the indication of a non-evaluated state of a dynamic logic gate until a control signal has ended. The control signal is connected to a precharge input of the control element and a summing node is connected to one or more evaluation trees and to the control element output via an inverter. The inverter is connected to an override circuit that forces the output of the control element to a state opposite the precharge state until the control signal has ended. The output of the control element then assumes a state corresponding to the precharge state until an evaluation occurs. The control element output thus produces a window signal indicating the interval between the end of the control signal and the evaluation.

20 Claims, 4 Drawing Sheets

DYNAMIC-STATIC LOGICAL CONTROL ELEMENT FOR SIGNALING AN INTERVAL BETWEEN THE END OF A CONTROL SIGNAL AND A LOGICAL EVALUATION

CROSS-REFERENCE TO RELATED APPLICATION

The present application is related to co-pending U.S. patent application "REGISTER FILE APPARATUS AND METHOD INCORPORATING READ-AFTER-WRITE BLOCKING USING DETECTION CELLS", Ser. No. 10/922,247, filed concurrently with this application by the same inventors and assigned to the same Assignee. The specification of the above-referenced application is incorporated herein by reference.

BACKGROUND OF THE INVENTION

1. Technical Field

The present invention relates generally to logical control circuits, and more particularly to a dynamic-static logical control element for signaling an interval between the end of a control signal and the beginning of a logical evaluation.

2. Description of the Related Art

Dynamic logic circuits are well known in field of digital circuits. Dynamic logic is used to decrease device count and increase speed in large-scale circuits such as very-large-scale-integration (VLSI) circuits. Often referred to as "domino" logic circuits due to their typically cascaded arrangement, clocked dynamic logic performs evaluation and storage functions in microprocessors, memories and other digital devices.

Dynamic logic circuits operate in a two-phase manner: clock signals are used to precharge nodes in the circuits to known values, typically at or near one of the power supply rails. Then, when the precharge clock changes state, an evaluation is performed by discharging the precharged nodes with ladders or "trees" of transistors connected in parallel-series arrangement to the opposite power supply rail. In a typical gate, with an inverter coupling a summing node to the output and N-channel transistor ladders used to pull down the summing node from a logical high level precharge state, each ladder combines its inputs in a logical AND function (as all transistors in a ladder must be on for the ladder to pull down the summing node), while the parallel connected ladders are combined in a logical OR function, as any activated ladder will pull down the summing node, resulting in a logical high level at the output of the dynamic logic gate.

In certain topologies and particular gate arrangements, static logic can be combined with dynamic logic to reduce circuit size, increase speed or provide other topological benefits.

Therefore, it is always desirable to combine static and dynamic functionality in a logic circuit when advantageous to reduce complexity or improve operation and thus provide additional logic gates and circuit arrangements that add logical building blocks to the state of the art.

SUMMARY OF THE INVENTION

The objectives of providing a new combination of static and dynamic logic that has advantages in operation and/or complexity is achieved in a logical control element that signals an interval between the end of a control signal and a logical evaluation.

The logical control element includes a dynamic logic tree comprising one or more transistor ladders connected between a summing node and a power supply rail and a precharge circuit connected between the summing node and the opposite power supply rail for precharging the summing node in response to a control signal. The summing node is connected to the input of an inverter that provides the output of the logical control element. A static override circuit is connected to the output of the logical control input and has an input coupled to the control signal and forces the output of the inverter to a state opposite what would be the normal precharge state of the logical control element, i.e., a state corresponding to an evaluation of the dynamic logic tree. The logical control element thereby provides a window signal that is active between the de-assertion of the control signal and an evaluation produced by the dynamic logic tree.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATIVE EMBODIMENT

Figure 1:
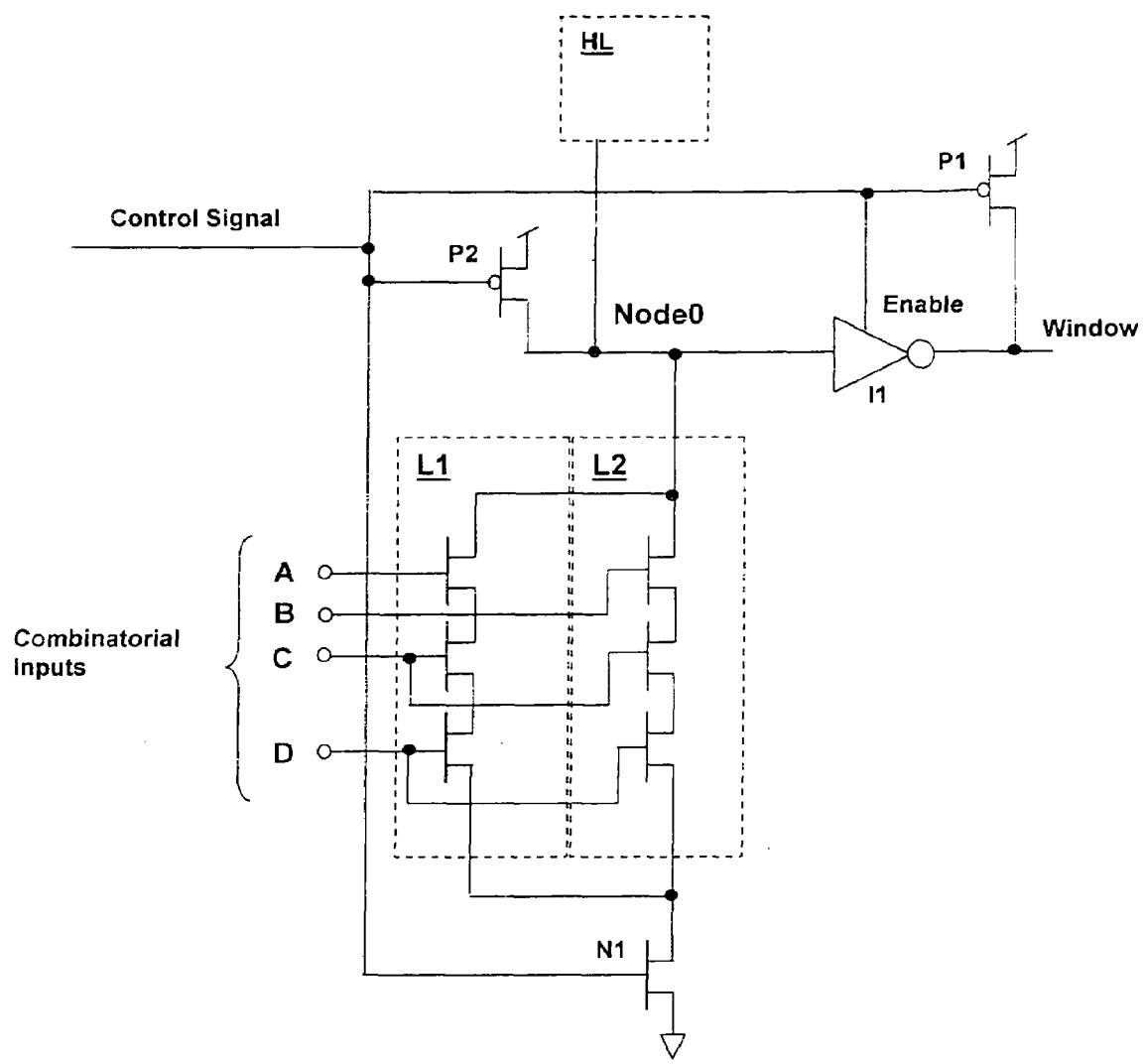
FIG. 1 is a schematic of a generic control element in accordance with an embodiment of the invention.

With reference now to the figures, and in particular with reference to FIG. 1, there is depicted a schematic diagram of a logical control element embodying a method and an apparatus in accordance with the present invention. A dynamic portion of the logical control element is provided by ladders L1 and L2 coupled between a summing node Node0 and ground. Ladders L1 and L2 thus form an N-tree or "tree" of N-channel transistors and if either ladder L1 and L2 is activated during the evaluation phase of the dynamic portion of the control element, summing node Node0 will be pulled low. A foot transistor N1 prevents shorting and/or discharging Node0 during the precharge phase of the dynamic portion of the control element and a precharge transistor P2 precharges node Node0 to a high level. It should be understood that an a equivalent structure could be made with P-channel transistors in place of N-channel transistors and vice-versa as long as the power supply rail polarities and signal polarities are reversed. It should be noted that not all dynamic logic trees are made of independent ladders, for example, the transistors receiving input signals C and D could be merged and thus the current paths also merged, forming a more complex tree.

The illustrated N-tree evaluates the equation A·C·D+ B·C·D, where "+" is the logical-OR operator and "·" is the logical-AND operator. However, any combinatorial equation could be implemented by changing the N-tree and the invention encompasses all such logic. A half-latch HL is optionally included to hold the state of Node0 when the precharge signal is not applied or after an evaluation has taken place. However, in some applications half-latch HL will not be required, such as in applications where the control element is clocked frequently. An inverter I1 has an input connected to summing node Node0 and provides the output of the control logic element.

Thus, the action of transistors P2 and N1, inverter I1 and ladders L1 and L2 provide the functionality and structure of a dynamic logic gate as well-known in the art. However, inverter I1 has an enable input that is not typically found in inverters used in this circuit position and further, the logical control element of the present invention includes a transistor P1 that overrides the value produced by the dynamic portion of the logical control element. Finally, the signal provided to precharge transistor P2 as well as to the enable input of inverter and to the gate of transistor P1 is not a typical precharge signal, which is generally one phase of a system clock, but rather is an actual control signal. The presence of half-latch HL ensures completely asynchronous operation, where the interval between assertions of the control signal may be long.

The logical control element of the present invention provides a control function by generating a window that starts with the leading edge of the control signal and ends either on the falling edge of the control signal or when an evaluation occurs at summing node Node0. Thus the logical control element of the present invention is useful for providing an output signal that is indicative of the time between the assertion of a control signal and the occurrence of a particular combination of logic signals. The output signal can be used to measure the time interval directly, used to block another signal until the particular logical input combination occurs and other applications in conformity with the above-described operation.

Transistor P1 serves to statically force the output of the logical control element to a high value (corresponding to the output state representing the evaluated state of Node0) when signal Control Signal is at a logical low level. When signal Control Signal transitions to a logical high level, inverter I1 is enabled and if Node0 has not already evaluated (due to the logical input signals having been in the particular combinatorial state), the output of the logical control element assumes a logical low level until the particular combinatorial state occurs, or until the Control Signal signal transitions back to a logical low level.

Figure 2:
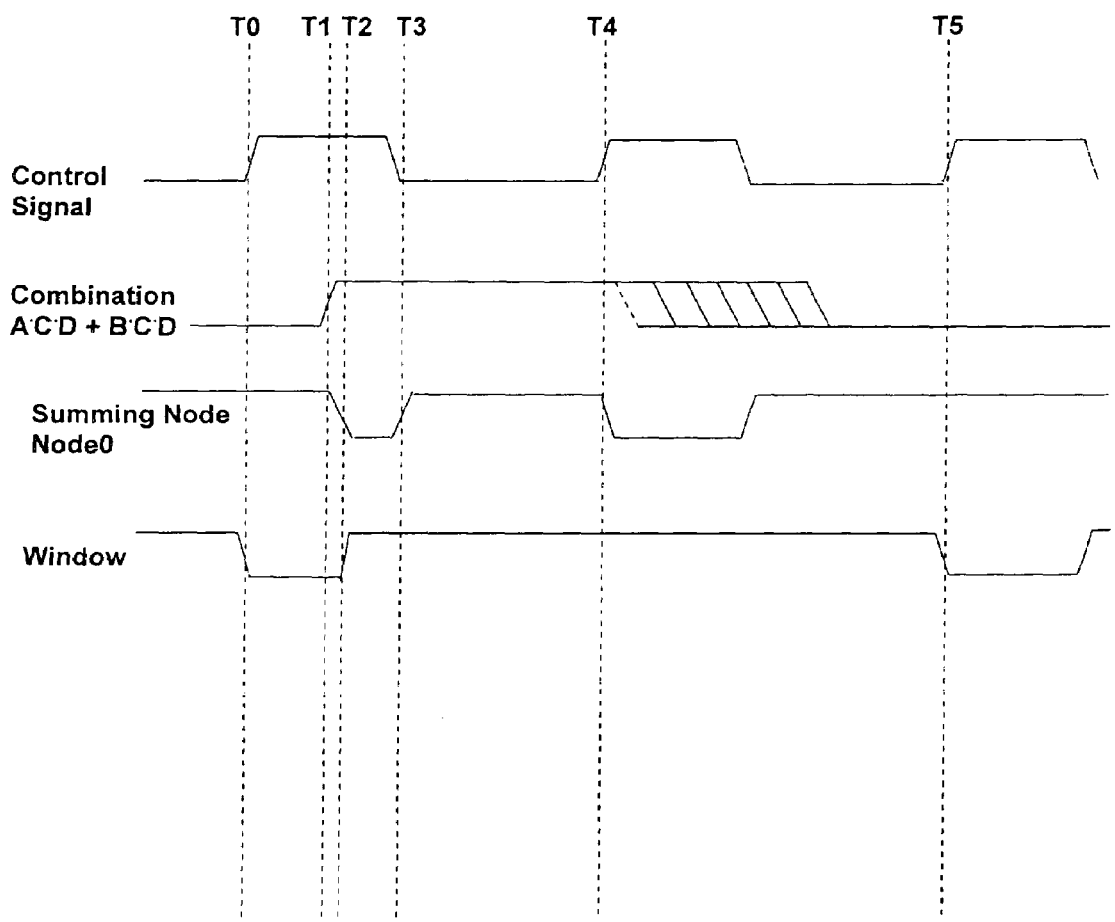
FIG. 2 is a timing diagram depicting the relationship of signals within the control element of FIG. 1.

Referring now to FIG. 2, a timing diagram illustrating the operation of the logical control element of FIG. 1 is depicted. While three regular periods of Control Signal are shown, it should be understood from the description above that Control Signal may be asynchronous and with the presence of half-latch HL, there are no constraints on the delay time between occurrences of Control Signal assertions. The three periods are used to illustrate three operating conditions. In the first period, the particular combination of logic signals, (A+B)·C·D=1 in the illustration, occurs during the assertion of Control Signal.

Prior to time T0, the logical control element output signal Window is held high by transistor P1 due to Control Signal being de-asserted. At time T0, Control Signal is asserted while Combination is FALSE. At this time, the logical control element output Window is driven low by inverter I1, which is enabled by the assertion of Control Signal. When the dynamic portion of the logical control element evaluates (due to Combination becoming TRUE at time T1) and evaluation results in Node0 being pulled low by the N-tree at time T2. Logical control element output Window is driven high by inverter I1 at time T2, ending the Window signal logical low-level pulse. At time T3, Control Signal is de-asserted and transistor P1 pulls the Window signal high, irrespective of the subsequent value of Combination. Thus, the pulse produced on the logical control element output Window will always be shorter or equal in length to the Control Signal input and Window will only be asserted when Control Signal is true. Therefore, the circuit of the present invention is appropriate for use when Control Signal qualifies a control function and the particular logical combination is used to terminate the control function, such as when a blocking signal for waiting on the assertion of Combination is needed to further qualify Control Signal.

In the second illustrated period of Control Signal, Combination is de-asserted during the occurrence of the Control Signal pulse. However, since Combination was TRUE at the onset of the Control Signal pulse, the N-tree has already evaluated and therefore no Window pulse is produced.

In the third illustrated period of Control Signal, Combination is de-asserted during the entire Control Signal pulse. Hence, since Combination remains FALSE throughout the Control Signal pulse, the N-tree never evaluates and therefore the Window pulse generated matches the Control Signal pulse.

Figure 3:
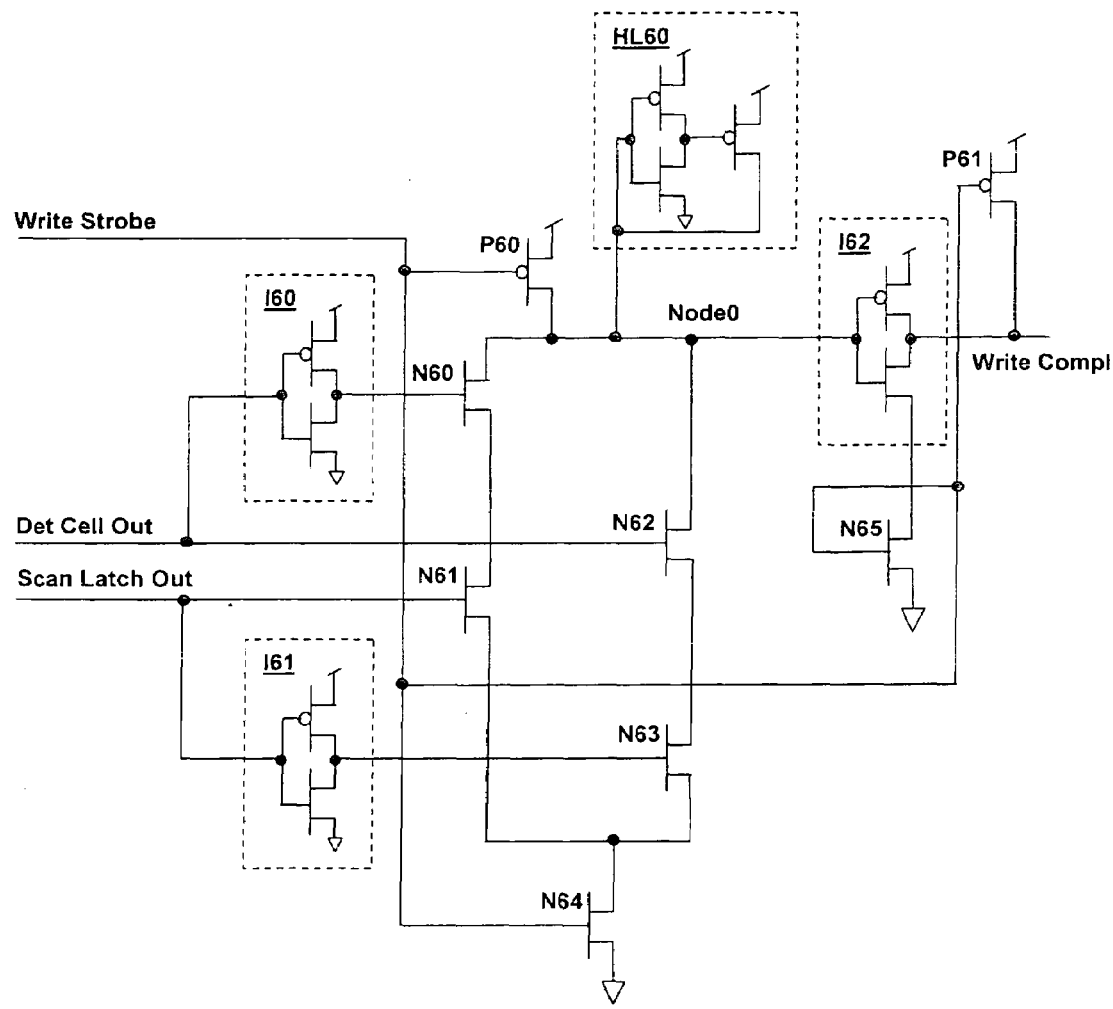
FIG. 3 is a schematic diagram depicting a specific control element in accordance with an embodiment of the present invention.

Referring now to FIG. 3, a specific logical control element circuit is shown that may be used to implement control logic used in the apparatus disclosed in the above-incorporated patent application. The logical control element is used to provide a Write Compl signal that indicates that completion of a write commenced by the Write Strobe signal has been completed at an external circuit. The condition signaling completion is when the two logic input signals Det Cell Out and Scan Latch Out differ in logical state. However, the combinatorial condition only validly indicates the write completion during the Write Strobe assertion. Thus the illustrated circuit is used to qualify the Write Strobe signal and the logical combination of the Det Cell Out and Scan Latch Out so the Write Compl signal is only asserted during the Write Strobe pulse and while the Det Cell Out and Scan Latch Out assume differing values.

The illustrated circuit has advantages in that only a few devices need be added over a standard dynamic XOR gate in order to provide a combined NAND-XNOR function that implements control logic in the register file apparatus disclosed in the above-incorporated patent application. A logical exclusive-NOR function is provided at an internal summing node Node0 by two N-device ladders, transistors N60 and N61 forming the first ladder and transistors N62 and N63 forming the second ladder. The gates of transistors N61 and N63 are driven by a scan latch output and a complement provided by inverter I61, respectively. Similarly, transistors N60 and N62 are driven by a detection cell output and a complement provided by inverter i60. The resulting function is a dynamic exclusive-NOR at Node 0, with precharge transistor P60 and foot transistor N64 completing the dynamic circuit function. A half-latch HL60 provides that the state of internal node Node0 will be maintained in the absence of the precharge signal both before and after an evaluation has occurred. Inverter I62 transforms the internal node signal Node0 to provide what would be a traditional exclusive-OR function at output Write Compl, but for the presence of output foot transistor N65 and output pull-up transistor P61. When the control Signal input (in this case the Write Strobe) signal is in a logic low state (during the absence of the write strobe), foot transistor N65 is turned off, disabling the action of the exclusive-OR by disabling inverter I62. Also, transistor P61 is turned on, causing the output of the circuit to be forced to a logic high value while the Write Strobe input is active (thus transistor N65 is necessary in order to prevent shorting the pulled-up output through inverter I62). The operation of the above-described circuit is counter-intuitive in that in typical dynamic logic gates, an output state change from the precharged state is reflective of an evaluated state of the internal summing node. However, in the illustrated circuit, the output state change is made upon de-assertion of the Write Strobe signal and remains until the circuit has evaluated. Thus the illustrated circuit is especially suitable for the operation of the apparatus and method disclosed in the above-incorporated patent application, in which it is desirable to generate a signal indicative of the time between the initiation of the row write and the change at the control logic input(s) due to the expiration of the inherent detection cell delay.

Figure 4:
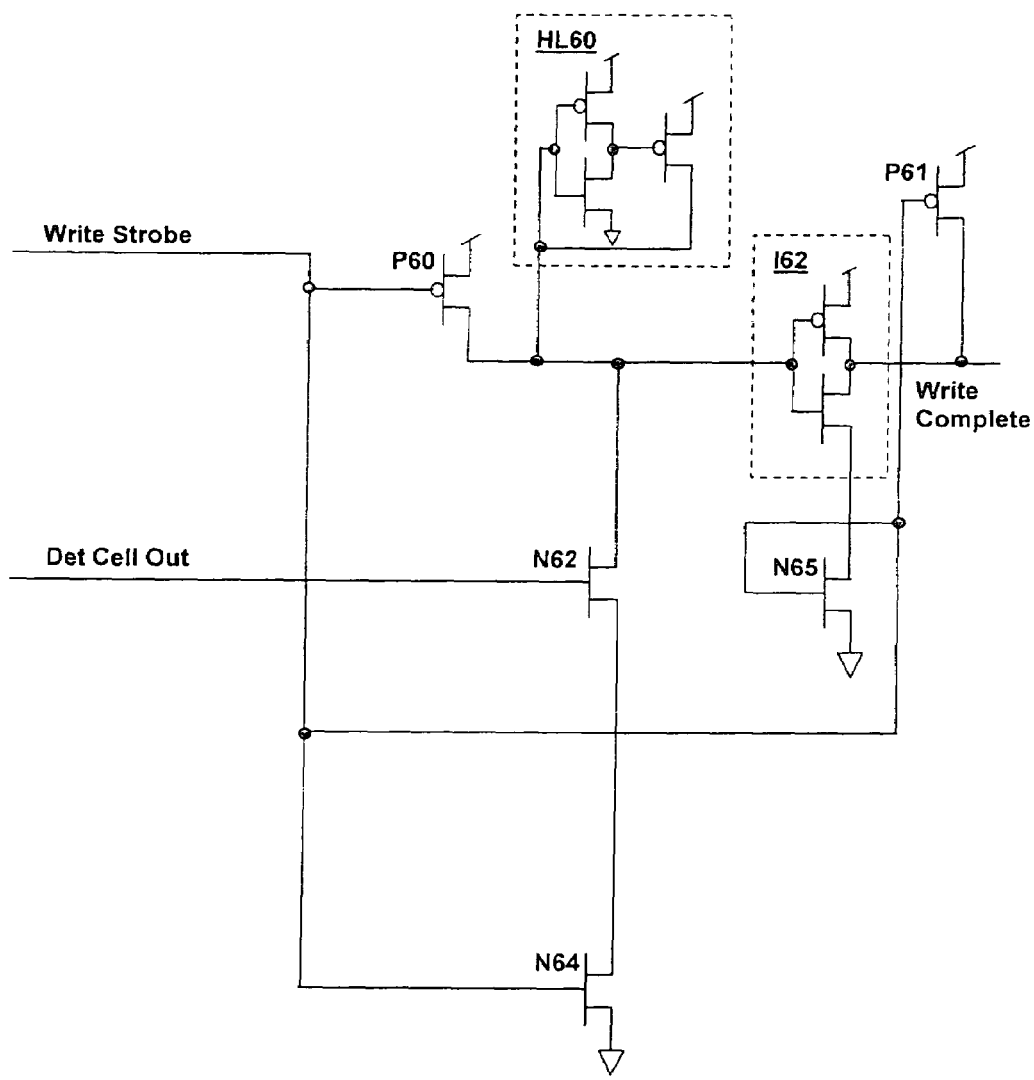
FIG. 4 is a schematic diagram depicting a specific control element in accordance with another embodiment of the present invention.

Referring now to FIG. 4, a specific logical control element circuit is shown that may be used to implement control logic used in an alternative apparatus disclosed in the above-incorporated patent application. The illustrated circuit is a simplification of the circuit of FIG. 3 and thus only differences will be described. The illustrated circuit provides the combined operation of a dynamic inverter and a static NAND gate. The N-tree in the circuit of FIG. 4 has been reduced to a single transistor N62, that provides a dynamic inverter function at the summing node, and thus a dynamic buffer at the Write Complete with the further control logic functionality of the invention as described above.

The balance of the circuit operates as described for the circuit of FIG. 3, with a logical NAND function imposed on the state of the internal summing node where one of the NAND inputs is the Write Strobe signal. When Write Strobe is asserted, the precharged state of the internal summing node will cause the output of the illustrated circuit to transition to a logical low state (after being held up by transistor P61 during the precharge cycle). When the detection cell output Det Cell Out transitions to a logical high state, the output of the illustrated circuit will return to a logical high state.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A logical control element for providing a window signal active between assertion of a control signal and a time at which a logical combination of one or more other signals assumes a predetermined state, said logical control element comprising:
   a dynamic logic tree formed from one or more transistor ladders comprising transistors having series connected channels coupled between a summing node and a first power supply rail corresponding to a first logical state, and wherein gates of said transistors are connected to said one or more other signals;
   a precharge circuit connected to said summing node and a second power supply rail for setting said summing node to a precharge voltage level corresponding to a second logical state opposite from said first logical state, said precharge circuit having an input coupled to said control signal, whereby said summing node is held in said second logical state while said control signal is deasserted;
   an inverter having an input coupled to said summing node and an inverter output providing said window signal at an output of said logical control element; and
   a static override circuit having an input coupled to said control signal and an output connected to said inverter output for forcing said inverter output to a voltage level corresponding to said second logical state while said control signal is active, whereby said output of said control element is held in a first logical output state corresponding to an evaluated state of said control element until said control signal is asserted, and wherein said output of said control element is thereafter held in an opposite state by said inverter until said logical combination of said one or more other signals assumes said predetermined state.

2. The logical control element of claim 1, wherein said static override circuit comprises a transistor having a gate connected to said control signal, a first channel connection connected to a second power supply rail corresponding to said second logical state and a second channel connection connected to said output of said logical control element.

3. The logical control element of claim 1, further comprising a disable circuit connected between said first power supply rail and an inverter power supply input of said inverter and having an enable input coupled to said control signal, whereby said inverter is disabled when said control signal is active, preventing conduction from said override circuit through said inverter to said first power supply rail.

4. The logical control element of claim 3, wherein said inverter comprises:
   a first transistor having a gate connected to said summing node, a first channel connection connected to said inverter power supply input and a second channel connection connected to said inverter output; and
   a second transistor having a gate connected to said summing node, a first channel connection connected to said inverter output and a second channel connection connected to said inverter power supply input, and wherein said disable circuit comprises a third transistor having a first channel connection connected to said inverter power supply input, a second channel connection connected to said first power supply rail and a gate connected to said control signal, whereby said inverter is isolated from said first power supply rail when said control signal is deasserted.

5. The logical control element of claim 1, further comprising a half-latch circuit connected between said second power supply rail and said summing node, whereby a precharged state of said summing node is maintained until altered by said dynamic logic tree.

6. The logical control element of claim 5, wherein said half-latch comprises:
   a second inverter having an input coupled to said summing node;
   a pullup transistor having a gate connected to an output of said second inverter, a first channel connection connected to said second power supply rail and a second channel connection connected to said summing node.

7. The logical control element of claim 1, wherein said control signal is a strobe commanding a write to an external storage element, wherein said logical combination of one or more other signals is an indication of whether or not said write is completed, and wherein said window signal is an indication that a pending write is not completed.

8. The logical control element of claim 1, further comprising a foot transistor having a gate connected to said control signal and channel connections coupled between said dynamic logic tree and said first power supply rail, whereby said dynamic logic tree is prevented from discharging said summing node while said control signal is deasserted.

9. The logical control element of claim 1, wherein said one or more other signals consists of a first signal and a second signal and wherein said predetermined state of said logical combination of said one or more other signals is indicative of a logical exclusive-OR of said first signal and said second signal, and wherein said dynamic logic tree comprises a first ladder having a first transistor with a gate connected to said first signal and a second transistor with a gate connected to an inverted version of said second signal, and a second ladder having a third transistor with a gate connected to said second signal and a fourth transistor with a gate connected to an inverted version of said second signal, whereby said dynamic logic tree discharges said summing node when said control signal is asserted if said first signal has a logical state opposite the logical state of the second signal.

10. The logical control element of claim 1, wherein said one or more other signals consists of a single signal wherein said predetermined state of said logical combination of said one or more other signals is indicative of an asserted state of said single signal, and wherein said dynamic logic tree comprises a single transistor with a gate connected to said single, whereby said dynamic logic tree discharges said summing node when said control signal is asserted if said single signal is asserted.

11. The logical control element of claim 1, further comprising:
a first transistor having a first channel connection connected to a power supply input of said inverter, a second channel connection connected to said first power supply rail and a gate connected to said control signal, whereby said inverter is isolated from said first power supply rail when said control signal is deasserted;
a foot transistor having a gate connected to said control signal and channel connections coupled between said dynamic logic tree and said first power supply rail, whereby said dynamic logic tree is prevented from discharging said summing node while said control signal is deasserted;
a second inverter having an input coupled to said summing node;
a pullup transistor having a gate connected to an output of said second inverter, a first channel connection connected to said second power supply rail and a second channel connection connected to said summing node, and wherein said static override circuit comprises a second transistor having a gate connected to said control signal, a first channel connection connected to a second power supply rail corresponding to said second logical state and a second channel connection connected to said output of said logical control element.

12. The logical control element of claim 11, wherein said one or more other signals consists of a first signal and a second signal and wherein said predetermined state of said logical combination of said one or more other signals is indicative of a logical exclusive-OR of said first signal and said second signal, and wherein said dynamic logic tree comprises a first ladder having a first transistor with a gate connected to said first signal and a second transistor with a gate connected to an inverted version of said second signal, and a second ladder having a third transistor with a gate connected to said second signal and a fourth transistor with a gate connected to an inverted version of said second signal, whereby said dynamic logic tree discharges said summing node when said control signal is asserted if said first signal has a logical state opposite the logical state of the second signal.

13. The logical control element of claim 11, wherein said one or more other signals consists of a single signal wherein said predetermined state of said logical combination of said one or more other signals is indicative of an asserted state of said single signal, and wherein said dynamic logic tree comprises a single transistor with a gate connected to said single, whereby said dynamic logic tree discharges said summing node when said control signal is asserted if said single signal is asserted.

14. A logical control element for providing a window signal active between assertion of a control signal and a time at which a logical combination of one or more other signals assumes a predetermined state, said logical control element comprising:
a dynamic logic tree formed from one or more transistor ladders comprising transistors having series connected channels coupled between a summing node and a first power supply rail corresponding to a first logical state, and wherein gates of said transistors are connected to said one or more other signals;
a precharge circuit connected to said summing node and a second power supply rail for setting said summing node to a precharge voltage level corresponding to a second logical state opposite from said first logical state, said precharge circuit having an input coupled to said control signal, whereby said summing node is held in said second logical state while said control signal is deasserted;
an inverter having an input coupled to said summing node and an inverter output providing said window signal at an output of said logical control element; and
means for overriding the output of said inverter, whereby said output of said control element is held in a first logical output state corresponding to an evaluated state of said control element until said control signal is asserted.

15. The logical control element of claim 14, further comprising a means for disabling said inverter, whereby said inverter is disabled when said control signal is active, preventing conduction from said overriding means through said inverter to said first power supply rail.

16. The logical control element of claim 14, further comprising means for holding a precharged state of said summing node while said control signal is asserted prior to said time at which said logical combination said of one or more other signals assumes said predetermined state.

17. A static-dynamic logic circuit having a control signal input and one or more logic inputs, comprising:
a logic tree comprising one or more ladders of ladder transistors having series-connected channels, wherein a first end of each of said ladders is connected to a summing node of said static-dynamic logic circuit and a second end of each of said ladders is coupled to a first power supply rail, and wherein said ladder transistors have gates coupled to said one or more logic inputs;
a first transistor having a first channel connection connected to an output of said static-dynamic logic circuit, a second channel connection connected to a second power supply rail and a gate connected to said control signal;

a second transistor having a first channel connection connected to said first power supply rail and a gate connected to said control signal;

a third transistor having a gate connected to said summing node, a first channel connection connected to a second channel connection of said second transistor and a second channel connection connected to said output;

a fourth transistor having a gate connected to said summing node, a first channel connection connected to said second channels connection of said second transistor and a second channel connection connected to said output;

a fifth transistor having a first channel connection connected to said summing node, a second channel connection connected to a second power supply rail and a gate connected to said control signal; and a sixth transistor having a first channel connection connected to said first power supply rail, a second channel connection connected to said second end of each of said ladders and a gate connected to said control signal.

18. The static-dynamic logic circuit of claim 17, further comprising:

a seventh transistor having a first channel connection connected to said summing node and a second channel connection connected to said second power supply rail;

an eighth transistor having a gate connected to said summing node, a first channel connection connected to a gate of said seventh transistor and a second channel connection connected to said first power supply rail; and a ninth transistor having a gate connected to said summing node, a first channel connection connected to a gate of said seventh transistor and a second channel connection connected to said second power supply rail.

19. The static-dynamic logic circuit of claim 18, further comprising:

a first inverter having an input connected to a first one of said logic inputs; and a second inverter having an input connected to a second one of said logic inputs, wherein said logic tree comprises two ladders of two ladder transistors each, wherein a first ladder transistor of a first ladder has a gate connected to said first logical input and a second ladder transistor of said first ladder has a gate connected to an output of said second inverter, and wherein a first ladder transistor of a second ladder has a gate connected to said second logical input and a second ladder transistor of said second ladder has a gate connected to an output of said first inverter.

20. The static-dynamic logic circuit of claim 18, wherein said one or more logic inputs consists of a single logical input, and wherein said logic tree consists of a single ladder transistor having a gate connected to said single logical input, a first channel connection connected to said second channel connection of said sixth transistor and a second channel connection connected to said summing node.

* * * * *

UNITED STATES PATENT AND TRADEMARK OFFICE
CERTIFICATE OF CORRECTION

| | | |
|---|---|---|
| PATENT NO. | : 7,015,723 B2 | Page 1 of 1 |
| APPLICATION NO. | : 10/922271 | |
| DATED | : March 21, 2006 | |
| INVENTOR(S) | : Chu et al. | |

It is certified that error appears in the above-identified patent and that said Letters Patent is hereby corrected as shown below:

In Claim 10, at column 7, line 30, "single" should read -- single signal --.

In Claim 13, at column 8, line 15, "single" should read -- single signal --.

Signed and Sealed this

Eleventh Day of July, 2006

JON W. DUDAS
*Director of the United States Patent and Trademark Office*